US008413007B2

(12) United States Patent
Pawlowski et al.

(10) Patent No.: US 8,413,007 B2
(45) Date of Patent: Apr. 2, 2013

(54) MEMORY SYSTEM AND METHOD USING ECC WITH FLAG BIT TO IDENTIFY MODIFIED DATA

(75) Inventors: J. Thomas Pawlowski, Boise, ID (US); John Schreck, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 226 days.

(21) Appl. No.: 13/026,833

(22) Filed: Feb. 14, 2011

(65) Prior Publication Data
US 2011/0138252 A1 Jun. 9, 2011

Related U.S. Application Data

(62) Division of application No. 11/583,198, filed on Oct. 18, 2006, now Pat. No. 7,900,120.

(51) Int. Cl.
*H03M 13/00* (2006.01)

(52) U.S. Cl. .................................................. 714/754

(58) Field of Classification Search ................ 714/6.1, 714/6.13, 746, 754, 763, 767
See application file for complete search history.

(56) References Cited

U.S. PATENT DOCUMENTS

| | | | |
|---|---|---|---|
| 4,006,468 A | 2/1977 | Webster | 340/173 DR |
| 4,334,295 A | 6/1982 | Nagami | 365/222 |
| 4,380,812 A | 4/1983 | Ziegler, II et al. | 371/38 |
| 4,433,211 A | 2/1984 | McCalmont et al. | 179/1.5 S |
| 4,493,081 A | 1/1985 | Schmidt | 371/38 |
| 4,598,402 A | 7/1986 | Matsumoto et al. | 371/38 |
| 4,617,660 A | 10/1986 | Sakamoto | 371/13 |
| 4,694,454 A | 9/1987 | Matsuura | 371/13 |
| 4,706,249 A | 11/1987 | Nakagawa et al. | 371/38 |
| 4,710,934 A | 12/1987 | Traynor | 371/38 |
| 4,766,573 A | 8/1988 | Takemae | 365/222 |
| 4,780,875 A | 10/1988 | Sakai | 371/38 |
| 4,858,236 A | 8/1989 | Ogasawara | 371/38 |
| 4,862,463 A | 8/1989 | Chen | 371/38 |
| 4,888,773 A | 12/1989 | Arlington et al. | |
| 4,918,692 A | 4/1990 | Hidaka et al. | 371/2.2 |
| 4,937,830 A | 6/1990 | Kawashima et al. | 371/40.1 |
| 4,958,325 A | 9/1990 | Nakagome et al. | 365/206 |
| 5,012,472 A | 4/1991 | Arimoto et al. | |
| 5,033,026 A | 7/1991 | Tsujimoto | 365/222 |
| 5,056,089 A | 10/1991 | Furuta et al. | 371/3 |
| 5,127,014 A | 6/1992 | Raynham | 371/37.3 |
| 5,172,339 A | 12/1992 | Noguchi et al. | 365/201 |
| 5,208,782 A | 5/1993 | Sakuta et al. | 365/230.03 |
| 5,278,796 A | 1/1994 | Tillinghast et al. | 365/211 |

(Continued)

OTHER PUBLICATIONS

Stojko, J. et al., "*Error-Correction Code*", IBM Technical Disclosure Bulletin, vol. 10, No. 10, Mar. 1968.

(Continued)

*Primary Examiner* — Shelly A Chase
(74) *Attorney, Agent, or Firm* — Dorsey & Whitney LLP

(57) ABSTRACT

A DRAM device includes an ECC generator/checker that generates ECC syndromes corresponding to items of data stored in the DRAM device. The DRAM device also includes an ECC controller that causes the ECC syndromes to be stored in the DRAM device. The ECC controller also causes a flag bit having a first value to be stored in the DRAM device when a corresponding ECC syndrome is stored. The ECC controller changes the flag bit to a second value whenever the corresponding data bits are modified, this indicating that the stored syndrome no longer corresponds to the stored data. In such case, the ECC controller causes a new ECC syndrome to be generated and stored, and the corresponding flag bit is reset to the first value. The flag bits may be checked in this manner during a reduced power refresh to ensure that the stored syndromes correspond to the stored data.

43 Claims, 6 Drawing Sheets

U.S. PATENT DOCUMENTS

| | | | | |
|---|---|---|---|---|
| 5,291,498 | A | 3/1994 | Jackson et al. | 371/40.1 |
| 5,307,356 | A | 4/1994 | Fifield | 371/40.1 |
| 5,313,425 | A | 5/1994 | Lee et al. | 365/201 |
| 5,313,464 | A | 5/1994 | Reiff | 371/2.1 |
| 5,313,475 | A | 5/1994 | Cromer et al. | 371/40.1 |
| 5,313,624 | A | 5/1994 | Harriman et al. | 395/575 |
| 5,321,661 | A | 6/1994 | Iwakiri et al. | 365/222 |
| 5,331,601 | A | 7/1994 | Parris | 365/230.08 |
| 5,335,201 | A | 8/1994 | Walther et al. | 365/222 |
| 5,369,651 | A | 11/1994 | Marisetty | 371/40.1 |
| 5,418,796 | A | 5/1995 | Price et al. | 371/39.1 |
| 5,428,630 | A | 6/1995 | Weng et al. | 371/40.1 |
| 5,432,802 | A | 7/1995 | Tsuboi | 371/40.1 |
| 5,446,695 | A | 8/1995 | Douse et al. | 365/222 |
| 5,448,578 | A | 9/1995 | Kim | 371/40.4 |
| 5,450,424 | A | 9/1995 | Okugaki et al. | 371/40.1 |
| 5,455,801 | A | 10/1995 | Blodgett et al. | 365/222 |
| 5,459,742 | A | 10/1995 | Cassidy et al. | 371/40.1 |
| 5,481,552 | A | 1/1996 | Aldereguia et al. | 371/40.1 |
| 5,509,132 | A | 4/1996 | Matsuda et al. | 395/403 |
| 5,513,135 | A | 4/1996 | Dell et al. | 365/52 |
| 5,515,333 | A | 5/1996 | Fujita et al. | 365/229 |
| 5,588,112 | A | 12/1996 | Dearth et al. | 395/182.07 |
| 5,600,662 | A | 2/1997 | Zook | 371/40.1 |
| 5,604,703 | A | 2/1997 | Nagashima | 365/200 |
| 5,623,506 | A | 4/1997 | Dell et al. | 371/40.1 |
| 5,629,898 | A | 5/1997 | Idei et al. | 365/222 |
| 5,631,914 | A | 5/1997 | Kashida et al. | 371/37.4 |
| 5,644,545 | A | 7/1997 | Fisch | 365/222 |
| 5,703,823 | A | 12/1997 | Douse et al. | 365/222 |
| 5,706,225 | A | 1/1998 | Buchenrieder et al. | 365/222 |
| 5,712,861 | A | 1/1998 | Inoue et al. | 371/37.1 |
| 5,732,092 | A | 3/1998 | Shinohara | 371/40.2 |
| 5,740,188 | A | 4/1998 | Olarig | 371/40.11 |
| 5,742,554 | A | 4/1998 | Fujioka | 365/222 |
| 5,754,753 | A | 5/1998 | Smelser | 395/182.06 |
| 5,761,222 | A | 6/1998 | Baldi | 371/40.18 |
| 5,765,185 | A | 6/1998 | Lambrache et al. | 711/103 |
| 5,784,328 | A | 7/1998 | Irrinki et al. | 365/222 |
| 5,784,391 | A | 7/1998 | Konigsburg | 371/40.18 |
| 5,808,952 | A | 9/1998 | Fung et al. | 365/222 |
| 5,841,418 | A | 11/1998 | Bril et al. | 345/3 |
| 5,864,569 | A | 1/1999 | Roohparvar | 371/40.18 |
| 5,878,059 | A | 3/1999 | Maclellan | 371/40.13 |
| 5,896,404 | A | 4/1999 | Kellogg et al. | 371/40.11 |
| 5,909,404 | A | 6/1999 | Schwarz | 365/201 |
| 5,912,906 | A | 6/1999 | Wu et al. | 371/40.11 |
| 5,953,278 | A | 9/1999 | McAdams et al. | 365/219 |
| 5,961,660 | A | 10/1999 | Capps, Jr. et al. | 714/763 |
| 5,963,103 | A | 10/1999 | Blodgett | 331/75 |
| 6,009,547 | A | 12/1999 | Jaquette et al. | 714/758 |
| 6,009,548 | A | 12/1999 | Chen et al. | 714/762 |
| 6,018,817 | A | 1/2000 | Chen et al. | 714/762 |
| 6,041,001 | A | 3/2000 | Estakhri | 365/200 |
| 6,041,430 | A | 3/2000 | Yamauchi | 714/752 |
| 6,052,815 | A | 4/2000 | Zook | 714/758 |
| 6,078,543 | A | 6/2000 | Kim | 365/230.03 |
| 6,085,283 | A | 7/2000 | Toda | 711/104 |
| 6,085,334 | A | 7/2000 | Giles et al. | 714/7 |
| 6,092,231 | A | 7/2000 | Sze | 714/758 |
| 6,101,614 | A | 8/2000 | Gonzales et al. | 714/6 |
| 6,125,467 | A | 9/2000 | Dixon | 714/763 |
| 6,134,167 | A | 10/2000 | Atkinson | 365/222 |
| 6,137,739 | A | 10/2000 | Kim | 365/205 |
| 6,166,980 | A | 12/2000 | Chun | 365/222 |
| 6,178,537 | B1 | 1/2001 | Roohparvar | 714/773 |
| 6,199,139 | B1 | 3/2001 | Katayama et al. | 711/106 |
| 6,212,118 | B1 | 4/2001 | Fujita | 365/222 |
| 6,212,631 | B1 | 4/2001 | Springer et al. | 713/1 |
| 6,216,246 | B1 | 4/2001 | Shau | 714/763 |
| 6,216,247 | B1 | 4/2001 | Creta et al. | 714/763 |
| 6,219,807 | B1 | 4/2001 | Ebihara et al. | 714/720 |
| 6,223,309 | B1 | 4/2001 | Dixon et al. | 714/703 |
| 6,233,717 | B1 | 5/2001 | Choi | 714/805 |
| 6,262,925 | B1 | 7/2001 | Yamasaki | 365/200 |
| 6,279,072 | B1 | 8/2001 | Williams et al. | 711/105 |
| 6,310,825 | B1 | 10/2001 | Furuyama | 365/233 |
| 6,324,119 | B1 | 11/2001 | Kim | 365/233 |
| 6,349,068 | B2 | 2/2002 | Takemae et al. | 365/222 |
| 6,349,390 | B1 | 2/2002 | Dell et al. | 714/6 |
| 6,353,910 | B1 | 3/2002 | Carnevale et al. | 714/763 |
| 6,397,290 | B1 | 5/2002 | Williams et al. | 711/105 |
| 6,397,357 | B1 | 5/2002 | Cooper | 714/703 |
| 6,397,365 | B1 | 5/2002 | Brewer et al. | 714/766 |
| 6,404,687 | B2 | 6/2002 | Yamasaki | 365/222 |
| 6,426,908 | B1 | 7/2002 | Kidaka | 365/222 |
| 6,438,066 | B1 | 8/2002 | Ooishi et al. | 365/233 |
| 6,442,644 | B1 | 8/2002 | Gustavson et al. | 711/105 |
| 6,457,153 | B2 | 9/2002 | Yamamoto et al. | 714/763 |
| 6,484,246 | B2 | 11/2002 | Tsuchida et al. | 711/169 |
| 6,487,136 | B2 | 11/2002 | Hidaka | 365/222 |
| 6,510,537 | B1 | 1/2003 | Lee | 714/763 |
| 6,518,595 | B2 | 2/2003 | Lee | 257/66 |
| 6,526,537 | B2 | 2/2003 | Kishino | 714/763 |
| 6,545,899 | B1 | 4/2003 | Derner et al. | 365/94 |
| 6,549,460 | B2 | 4/2003 | Nozoe et al. | 365/185.09 |
| 6,556,497 | B2 | 4/2003 | Cowles et al. | 365/222 |
| 6,557,072 | B2 | 4/2003 | Osborn | 711/106 |
| 6,560,155 | B1 | 5/2003 | Hush | 365/222 |
| 6,570,803 | B2 | 5/2003 | Kyung | 365/222 |
| 6,584,543 | B2 | 6/2003 | Williams et al. | 711/105 |
| 6,591,394 | B2 | 7/2003 | Lee et al. | 714/766 |
| 6,594,796 | B1 | 7/2003 | Chiang | 714/800 |
| 6,601,211 | B1 | 7/2003 | Norman | 714/773 |
| 6,603,694 | B1 | 8/2003 | Frankowsky et al. | 365/222 |
| 6,603,696 | B2 | 8/2003 | Janzen | 365/222 |
| 6,603,697 | B2 | 8/2003 | Janzen | 365/222 |
| 6,603,698 | B2 | 8/2003 | Janzen | 365/222 |
| 6,609,236 | B2 | 8/2003 | Watanabe et al. | 716/8 |
| 6,614,698 | B2 | 9/2003 | Ryan et al. | 365/189.04 |
| 6,618,281 | B1 | 9/2003 | Gordon | 365/49 |
| 6,618,314 | B1 | 9/2003 | Fiscus et al. | 365/227 |
| 6,618,319 | B2 | 9/2003 | Ooishi et al. | 365/233 |
| 6,628,558 | B2 | 9/2003 | Fiscus | 365/222 |
| 6,633,509 | B2 | 10/2003 | Scheuerlein et al. | |
| 6,636,444 | B2 | 10/2003 | Uchida et al. | 365/189.05 |
| 6,636,446 | B2 | 10/2003 | Lee et al. | 365/194 |
| 6,646,942 | B2 | 11/2003 | Janzen | 365/222 |
| 6,662,333 | B1 | 12/2003 | Zhang et al. | 714/767 |
| 6,665,231 | B2 | 12/2003 | Mizuno et al. | 365/233 |
| 6,678,860 | B1 | 1/2004 | Lee | 714/763 |
| 6,681,332 | B1 | 1/2004 | Byrne et al. | 713/300 |
| 6,697,926 | B2 | 2/2004 | Johnson et al. | 711/167 |
| 6,697,992 | B2 | 2/2004 | Ito et al. | 714/763 |
| 6,701,480 | B1 | 3/2004 | Karpuszka et al. | 714/764 |
| 6,704,230 | B1 | 3/2004 | DeBrosse et al. | 365/201 |
| 6,715,104 | B2 | 3/2004 | Imbert de Tremiolles et al. | 714/25 |
| 6,715,116 | B2 | 3/2004 | Lester et al. | 714/718 |
| 6,721,223 | B2 | 4/2004 | Matsumoto et al. | 365/222 |
| 6,735,726 | B2 | 5/2004 | Muranaka et al. | 714/708 |
| 6,751,143 | B2 | 6/2004 | Morgan et al. | 365/222 |
| 6,754,858 | B2 | 6/2004 | Borkenhagen et al. | 714/720 |
| 6,775,190 | B2 | 8/2004 | Setogawa | 365/193 |
| 6,778,457 | B1 | 8/2004 | Burgan | 365/222 |
| 6,781,908 | B1 | 8/2004 | Pelley et al. | 365/222 |
| 6,785,837 | B1 | 8/2004 | Kilmer et al. | 714/7 |
| 6,788,616 | B2 | 9/2004 | Takahashi | 365/233 |
| 6,789,209 | B1 | 9/2004 | Suzuki et al. | 713/401 |
| 6,792,567 | B2 | 9/2004 | Laurent | 714/763 |
| 6,795,362 | B2 | 9/2004 | Nakai et al. | 365/222 |
| 6,799,291 | B1 | 9/2004 | Kilmer et al. | 714/722 |
| 6,807,108 | B2 | 10/2004 | Maruyama et al. | 365/189.05 |
| 6,810,449 | B1 | 10/2004 | Barth et al. | 710/61 |
| 6,819,589 | B1 | 11/2004 | Aakjer | 365/185.02 |
| 6,819,624 | B2 | 11/2004 | Acharya et al. | 365/233 |
| 6,834,022 | B2 | 12/2004 | Derner et al. | 365/222 |
| 6,920,523 | B2 | 7/2005 | Le et al. | 711/106 |
| 6,934,199 | B2 | 8/2005 | Johnson et al. | 365/194 |
| 6,940,773 | B2 | 9/2005 | Poechmueller | 365/222 |
| 6,940,774 | B2 | 9/2005 | Perner | 365/222 |
| 6,944,074 | B2 | 9/2005 | Chung et al. | 365/200 |
| 6,965,537 | B1 | 11/2005 | Klein et al. | 365/222 |
| 7,002,397 | B2 | 2/2006 | Kubo et al. | 327/534 |
| 7,027,337 | B2 | 4/2006 | Johnson et al. | 365/194 |
| 7,051,260 | B2 | 5/2006 | Ito et al. | 714/754 |
| 7,095,669 | B2 | 8/2006 | Oh | 365/222 |

| | | | |
|---|---|---|---|
| 7,096,407 B2 | 8/2006 | Olarig | 714/768 |
| 7,099,221 B2 | 8/2006 | Klein | 365/222 |
| 7,116,602 B2 | 10/2006 | Klein | 365/222 |
| 7,117,420 B1 | 10/2006 | Yeung et al. | 714/763 |
| 7,149,141 B2 | 12/2006 | Johnson et al. | 365/226 |
| 7,167,403 B2 | 1/2007 | Riho et al. | 365/200 |
| 7,171,605 B2 | 1/2007 | White | 714/763 |
| 7,184,351 B2 | 2/2007 | Ito et al. | 365/222 |
| 7,184,352 B2 | 2/2007 | Klein et al. | |
| 7,190,628 B2 | 3/2007 | Choi et al. | 365/222 |
| 7,216,198 B2 | 5/2007 | Ito et al. | 711/106 |
| 7,225,390 B2 | 5/2007 | Ito et al. | 714/777 |
| 7,231,488 B2 | 6/2007 | Poechmueller | 711/106 |
| 7,249,289 B2 | 7/2007 | Muranaka et al. | 714/48 |
| 7,254,067 B2 | 8/2007 | Johnson et al. | 365/194 |
| 7,269,085 B2 | 9/2007 | Sohn et al. | 365/222 |
| 7,272,773 B2 | 9/2007 | Cargnoni et al. | 714/763 |
| 7,317,648 B2 | 1/2008 | Jo | 365/222 |
| 7,318,183 B2 | 1/2008 | Ito et al. | 714/754 |
| 7,372,749 B2 | 5/2008 | Poechmueller | 365/200 |
| 7,444,577 B2 | 10/2008 | Best et al. | 714/745 |
| 7,453,758 B2 | 11/2008 | Hoffmann | 365/230.04 |
| 7,478,285 B2 | 1/2009 | Fouquet-Lapar | 714/42 |
| 7,493,531 B2 | 2/2009 | Ito et al. | |
| 7,500,171 B2 | 3/2009 | Suzuki | 714/763 |
| 7,539,926 B1 * | 5/2009 | Lesea | 714/776 |
| 2001/0023496 A1 | 9/2001 | Yamamoto et al. | 714/763 |
| 2001/0029592 A1 | 10/2001 | Walker et al. | 714/42 |
| 2001/0044917 A1 | 11/2001 | Lester et al. | 714/718 |
| 2001/0052090 A1 | 12/2001 | Mio | 714/42 |
| 2001/0052102 A1 | 12/2001 | Roohparvar | 714/773 |
| 2002/0013924 A1 | 1/2002 | Yamasoto | 714/763 |
| 2002/0029316 A1 | 3/2002 | Williams et al. | 711/105 |
| 2002/0144210 A1 | 10/2002 | Borkenhagen et al. | 714/805 |
| 2002/0152444 A1 | 10/2002 | Chen et al. | 714/785 |
| 2002/0162069 A1 | 10/2002 | Laurent | 714/763 |
| 2002/0184592 A1 | 12/2002 | Koga et al. | 714/763 |
| 2003/0009721 A1 | 1/2003 | Hsu et al. | 714/773 |
| 2003/0070054 A1 | 4/2003 | Williams et al. | 711/173 |
| 2003/0093744 A1 | 5/2003 | Leung et al. | 714/763 |
| 2003/0097608 A1 | 5/2003 | Rodeheffer et al. | 714/7 |
| 2003/0101405 A1 | 5/2003 | Shibata | 714/763 |
| 2003/0128612 A1 | 7/2003 | Moore et al. | 365/222 |
| 2003/0149855 A1 | 8/2003 | Shibata et al. | 711/200 |
| 2003/0167437 A1 | 9/2003 | DeSota et al. | 714/763 |
| 2003/0191888 A1 | 10/2003 | Klein | 711/105 |
| 2004/0008562 A1 | 1/2004 | Ito et al. | 365/223 |
| 2004/0064646 A1 | 4/2004 | Emerson et al. | 711/131 |
| 2004/0083334 A1 | 4/2004 | Chang et al. | 711/103 |
| 2004/0098654 A1 | 5/2004 | Cheng et al. | 714/758 |
| 2004/0117723 A1 | 6/2004 | Foss | 714/805 |
| 2004/0205429 A1 | 10/2004 | Yoshida et al. | 714/718 |
| 2004/0225944 A1 | 11/2004 | Brueggen | 714/758 |
| 2005/0099868 A1 | 5/2005 | Oh | 365/222 |
| 2005/0146958 A1 | 7/2005 | Moore et al. | 365/203 |
| 2005/0289444 A1 | 12/2005 | Klein | 714/793 |
| 2006/0010339 A1 | 1/2006 | Klein | 714/5 |
| 2006/0056259 A1 | 3/2006 | Klein | 365/222 |
| 2006/0056260 A1 | 3/2006 | Klein | 365/222 |
| 2006/0069856 A1 | 3/2006 | Klein | 711/106 |
| 2006/0152989 A1 | 7/2006 | Klein | 365/222 |
| 2006/0158949 A1 | 7/2006 | Klein | 365/222 |
| 2006/0158950 A1 | 7/2006 | Klein | 365/222 |
| 2006/0206769 A1 | 9/2006 | Klein | 714/52 |
| 2006/0218469 A1 | 9/2006 | Klein | 714/763 |
| 2007/0268756 A1 | 11/2007 | Johnson et al. | 365/189.01 |
| 2008/0002503 A1 | 1/2008 | Klein | 365/222 |
| 2008/0092016 A1 | 4/2008 | Pawlowski | 714/764 |
| 2008/0151671 A1 | 6/2008 | Klein | 365/222 |
| 2009/0024884 A1 | 1/2009 | Klein | 714/718 |
| 2009/0067267 A1 | 3/2009 | Johnson et al. | 365/191 |
| 2010/0054070 A1 | 3/2010 | Klein | 365/222 |
| 2011/0038217 A1 | 2/2011 | Johnson et al. | 365/189.16 |
| 2013/0003467 A1 | 1/2013 | Klein | |

OTHER PUBLICATIONS

Youji Idei et al; *Dual-Period Self-Refresh Scheme for Low-Power DRAM's with On-Chip PROM Mode Register*; IEEE Journal of Solid State Circuits, vol. 33, No. 2, Feb. 1998, pp. 253-259.

* cited by examiner

MEMORY SYSTEM AND METHOD USING ECC WITH FLAG BIT TO IDENTIFY MODIFIED DATA

CROSS-REFERENCE TO RELATED APPLICATION

This application is a divisional of U.S. patent application Ser. No. 11/583,198, filed Oct. 18, 2006, U.S. Pat. No. 7,900,120. This application is incorporated by reference herein in its entirety and for all purposes.

TECHNICAL FIELD

This invention relates to memory devices, and, more particularly, to a method and system for efficiently checking and correcting data read from memory devices to allow the memory devices to consume relatively little power during refresh.

BACKGROUND OF THE INVENTION

As the use of electronic devices, such as personal computers, continues to increase, it is becoming ever more important to make such devices portable. The usefulness of portable electronic devices, such as notebook computers, is limited by the limited length of time batteries are capable of powering the device before needing to be recharged. This problem has been addressed by attempts to increase battery life and attempts to reduce the rate at which such electronic devices consume power.

Various techniques have been used to reduce power consumption in electronic devices, the nature of which often depends upon the type of power consuming electronic circuits that are in the device. For example, electronic devices such as notebook computers, typically include memory devices, such as dynamic random access memory ("DRAM") devices, that consume a substantial amount of power. As the data storage capacity and operating speeds of memory devices continue to increase, the power consumed by such devices has continued to increase in a corresponding manner. Therefore, many attempts to reduce the power consumed by an electronic device have focused on reducing the power consumption of memory devices.

In general, the power consumed by a memory device increases with both the capacity and the operating speed of the memory device. The power consumed by memory devices is also affected by their operating mode. For example, a DRAM device generally consumes a relatively large amount of power when the memory cells of the DRAM device are being refreshed. As is well-known in the art, DRAM memory cells, each of which essentially consists of a capacitor, must be periodically refreshed to retain data stored in the DRAM device. Refresh is typically performed by essentially reading data bits from the memory cells in each row of a memory cell array and then writing those same data bits back to the same cells in the row. A relatively large amount of power is consumed when refreshing a DRAM because rows of memory cells in a memory cell array are being actuated in the rapid sequence. Each time a row of memory cells is actuated, a pair of digit lines for each memory cell are switched to complementary voltages and then equilibrated. As a result, DRAM refreshes tend to be particularly power-hungry operations. Further, since refreshing memory cells must be accomplished even when the DRAM is not being used and is thus inactive, the amount of power consumed by refresh is a critical determinant of the amount of power consumed by the DRAM over an extended period. Thus many attempts to reduce power consumption in DRAM devices have focused on reducing the rate at which power is consumed during refresh.

Refresh power can, of course, be reduced by reducing the rate at which the memory cells in a DRAM are being refreshed. However, reducing the refresh rate increases the risk that data stored in the DRAM memory cells will be lost. More specifically, since, as mentioned above, DRAM memory cells are essentially capacitors, charge inherently leaks from the memory cell capacitors, which can change the value of a data bit stored in the memory cell over time. However, current leaks from capacitors at varying rates. Some capacitors are essentially short-circuited and are thus incapable of storing charge indicative of a data bit. These defective memory cells can be detected during production testing, and can then be repaired by substituting non-defective memory cells using conventional redundancy circuitry. On the other hand, current leaks from most DRAM memory cells at much slower rates that span a wide range. A DRAM refresh rate is chosen to ensure that all but a few memory cells can store data bits without data loss. This refresh rate is typically once every 64 ms. The memory cells that cannot reliably retain data bits at this refresh rate are detected during production testing and replaced by redundant memory cells.

One technique that has been used to prevent data errors during refresh as well as at other times is to generate an error correcting code "ECC," which is known as a "syndrome," from each item of stored data, and then store the syndrome along with the data. When the data are read from the memory device, the syndrome is also read, and it is then used to determine if any bits of the data are in error. As long as not too many data bits are in error, the syndrome may also be used to correct the read data.

The use of ECC techniques can allow DRAM devices to be refreshed at a slower refresh rate since resulting data bit errors can be corrected as long as the refresh rate is not so low that more errors are generated than can be corrected by ECC techniques. The use of a slower refresh rate can provide the significant advantage of reducing the power consumed by DRAM devices. Prior to entering a reduced power refresh mode, each item of data is read. A syndrome corresponding to the read data is then generated and stored in the DRAM device. When exiting the reduced power refresh mode, the each item of data and each corresponding syndrome are read from the DRAM device. The read syndrome is then used to determine if the item of read data is in error. If the item of read data is found to be in error, the read syndrome is used to correct the read item of data, and the incorrect item of data is then overwritten with the corrected item of data.

One disadvantage of using the above-described ECC techniques in memory systems is the time and power required to generate and store ECC syndromes when entering the reduced power refresh mode. Each time the reduced power refresh mode is entered, all of the data stored in the DRAM device must be read, and a syndrome must be generated for each item or group of items of read data. The generated syndromes must then be stored. It can require a substantial period of time to accomplish these operations for the large amount of data stored in conventional high-capacity DRAM devices. During this time that the stored data are being checked, the DRAM device generally cannot be accessed for a read or a write operation. As a result, the operation of memory access devices, such as processors, is stalled until the data checking operations have been completed. Furthermore, a substantial amount of power can be consumed during the time the stored data are being checked and possibly corrected. These operations must be performed even though very little if any of the data stored in the DRAM device may have changed since the data was previously read and corresponding syndromes stored.

A similar problem exists where ECC techniques are being used to correct data storage errors in normal operation, i.e., not for a reduced power refresh mode. Each time a read request is coupled to a DRAM or other memory device, the syndrome corresponding to the read data must also be read, and the read data must then be checked using the read syndrome. These operations must be performed each time a read request is received even though the read data may not have changed since the read data was either written or previously read. The time required to perform these operations increases the latency of the memory device since the read data are not accessible to a memory requester until after these operations have been completed.

There is therefore a need for a memory system and method that uses ECC techniques to insure data integrity and allow operations in a reduced power refresh mode, but does so in a manner that does not unduly increase the read latency or power consumption of the memory device.

SUMMARY OF THE INVENTION

An error checking and correction ("ECC") method and system includes an ECC syndrome and a respective flag bit stored for each of a plurality of groups of data bits stored in an array of memory cells. The flag bit has a first value when the ECC syndrome is stored, and a second value if any of the data bits in the respective group are modified such as by writing data to the memory cells storing the data bits. The ECC method and system may be used in a reduced power refresh mode by checking the flag bit corresponding to each group of data bits and then generating and storing a new syndrome if the flag bit has the second value indicative of at least some of the data bits in a group were modified since the previous refresh. The ECC method and system may also be used during refresh or in normal operation to determine if an ECC syndrome can be used to check and correct corresponding data. When used in this manner, the ECC syndrome is used to check the correctness of the data bits, and, if an error is found, to generate corrected data bits. The corrected data bits can then be stored in the memory device.

DETAILED DESCRIPTION

Figure 1:
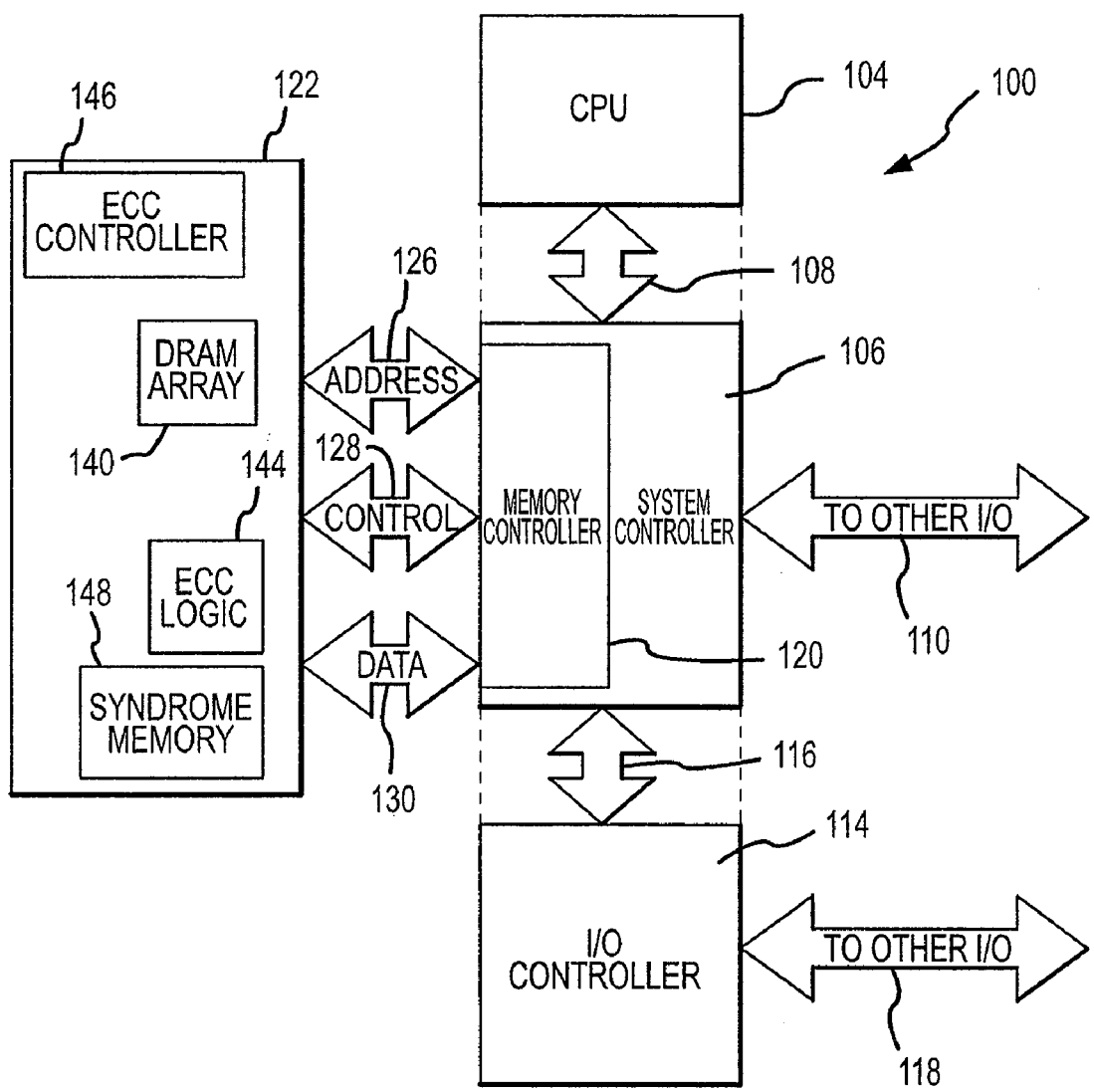
FIG. 1 is a block diagram of a computer system according to one of the invention.

A computer system 100 including a memory device employing ECC techniques according to one embodiment of the invention is shown in FIG. 1. The computer system 100 includes a central processor unit ("CPU") 104 coupled to a system controller 106 through a processor bus 108. The system controller 106 is coupled to input/output ("I/O") devices (not shown) through a peripheral bus 110 and to an I/O controller 114 through an expansion bus 116. The I/O controller 114 is also connected to various peripheral devices (not shown) through an I/O bus 118. The system controller 106 includes a memory controller 120 that is coupled to a dynamic random access memory ("DRAM") 122 through an address bus 126, a control bus 128, and a data bus 130. The DRAM 122 includes a DRAM array 140 that stores data. The locations in the DRAM 122 to which data are written and data are read are designated by addresses coupled to the DRAM 122 on the address bus 126. The operation of the DRAM 122 is controlled by control signals coupled to the DRAM 122 on the control bus 128. These control signals can cause the DRAM 122 to operate in various refresh modes, such as a "self-refresh" mode in which periodic refresh cycles are periodically initiated without the need to apply control signals to the DRAM 122. The DRAM 122 also includes ECC logic 144 that is operable to generate syndromes corresponding to data stored in the DRAM array 140, and to check and, if necessary, correct data. The operation of the ECC logic 144 is controlled by an ECC controller 146. The syndromes generated by the ECC logic 144 are stored in a syndrome memory 148.

Figure 2:
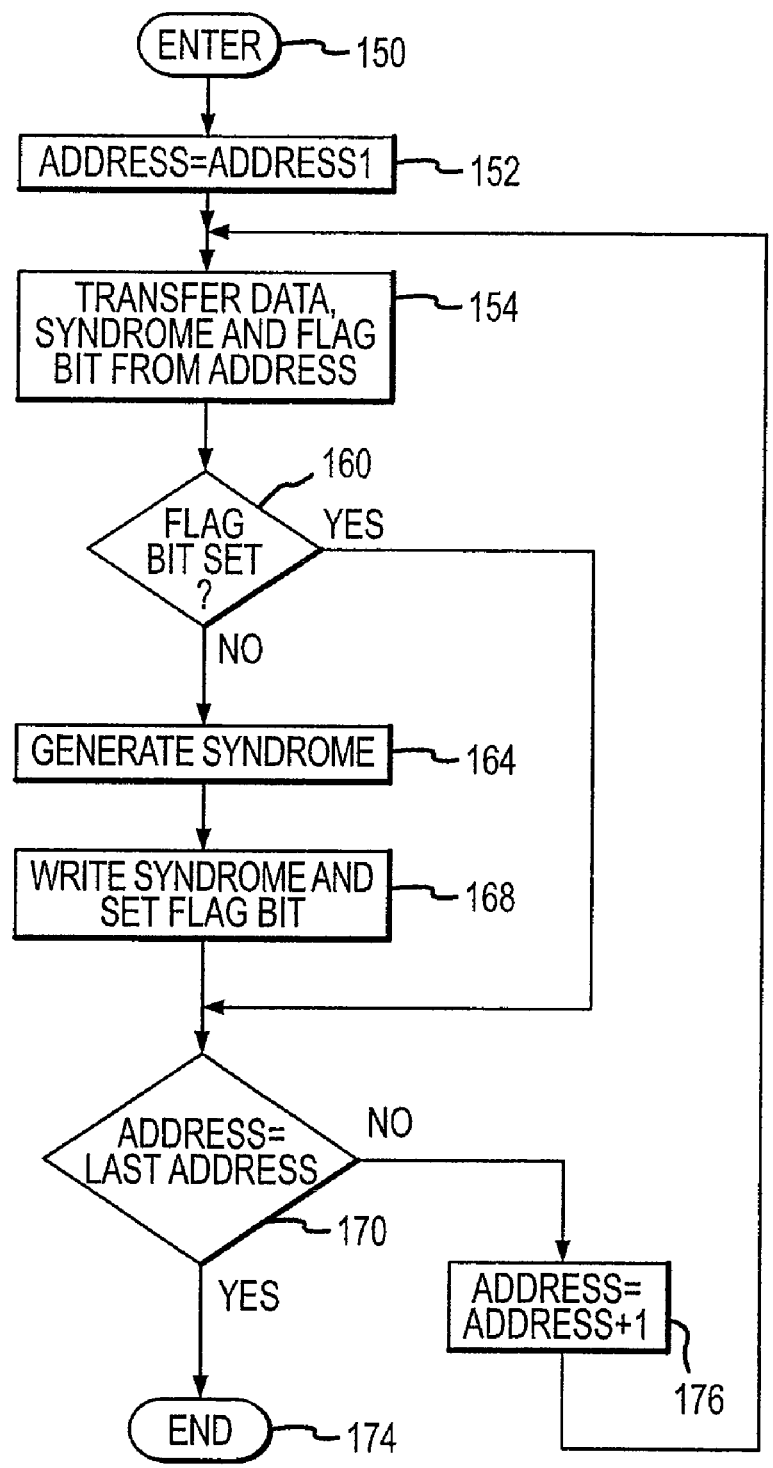
FIG. 2 is a flow chart showing the operation of the memory device of FIG. 1 in a low power refresh mode.

According to one embodiment of the invention, the DRAM 122 enters a reduced power mode refresh mode, such as a self-refresh mode, at step 150 using the process shown in FIG. 2. In step 152, the ECC controller 146 initializes an address to a first address in the DRAM array 140. This address is preferably the address for the first row of memory cells in the DRAM array 140 since the refresh of the DRAM array 140 is performed on a row-by-row basis. In step 154, the ECC controller 146 causes data stored in the DRAM array 140 at a current address (which is initially the first address) and a corresponding syndrome and flag bit to be transferred from the DRAM array 140 and the syndrome memory 148, respectively, to the ECC logic 144. In transferring the data from the DRAM array 140, the memory cells storing the data are inherently refreshed.

The ECC logic 144 initially does not use the syndrome to check the read data. Instead, the ECC logic 144 checks to see if a flag bit appended to the syndrome has been set at step 160. The flag bit is an extra bit appended to the syndrome that indicates whether the stored data corresponding to the syndrome has been modified since the ECC syndrome was generated. The first time the DRAM 122 enters the reduced power refresh mode, a syndrome will not have been generated for the data, and the flag bit will not have been set. Therefore, the process branches to step 164 where the ECC logic 144 generates a syndrome corresponding to the data. The ECC controller 146 then causes the syndrome and set flag bit to be written to the syndrome memory 148 at step 168. A check is then made at step 170 to determine if the data transferred to the ECC logic 144 was stored in the DRAM array 140 at the last address in the DRAM array 140. If it is, the process ends at step 174 until the low power refresh is again initiated at step 150. If the data is not from the last address in the DRAM array 140, the address is incremented at step 176, and the process returns to step 154.

When the DRAM 122 subsequently enters the reduced power refresh mode, the process shown in FIG. 2 again starts at 150. The ECC controller 146 again initializes an address to a first address in the DRAM array 140 and then causes data stored in the DRAM array 140 and a corresponding syndrome and flag bit to be transferred to the ECC logic 144. In transferring the data from the DRAM array 140, the memory cells storing the data are again refreshed. The ECC logic 144 again checks to see if a flag bit appended to the syndrome has been set at step 160. If the DRAM array 140 was previously refreshed in the reduced power mode and if no data have been written to the memory cells corresponding to the current address since the last refresh, the flag bit will still be set. The process shown in FIG. 2 then branches directly to step 170, thus bypassing step 164 where a syndrome is generated and step 168 where the syndrome and set flag bit are written to the syndrome memory 148. The process then loops through steps 154-176 until the entire DRAM array 140 has been refreshed. The use of ECC techniques in the reduced power refresh mode allows refresh to occur at a rate that is sufficiently low that data retention errors can be expected since a limited number of data retention errors can be corrected As is well known in the art, ECC techniques allow a limited number of bits to be corrected. Therefore, the refresh rate in the reduced power refresh mode should not be so low that more errors are generated in a group of data than can be corrected by the ECC techniques. This reduced refresh rate can significantly reduce the power consumed by the DRAM 122.

It is possible for the data stored in the DRAM array 140 to be modified between refreshes by, for example, writing data to the DRAM array 140. For this reason, each time data are written to the DRAM array 140, the ECC logic 144 resets the flag bit appended to the syndrome corresponding to the data stored in the memory cells to which the data are written.

One of the advantages of using the process shown in FIG. 2 is that, in many cases, it will be necessary to generate and store syndromes for very few memory cells in the DRAM array 140. When the DRAM 122 is idle, as it generally will be when in a reduced power refresh mode, such as a self-refresh mode, data will not be written to the DRAM array 140. As a result, the flag bit appended to almost all syndromes will still be set, thus making it unnecessary to generate and store syndromes for almost all of the memory cells in the DRAM array 140. As a result, the power consumed by the DRAM 122 is reduced by the amount of power that would be consumed in performing these syndrome generating and storing operations. Without using the process shown in FIG. 2, it would be necessary to generate and store syndromes for all of the data stored in the DRAM array 140 each time the reduced power refresh mode was entered thereby consuming substantially more power.

The reduced power refresh mode of the DRAM 122 also may be conducted using alternate processes. For example, prior to entering a reduced power refresh mode, the ECC logic 144 can generate a syndrome from all of the data stored in the DRAM array 140, and each generated syndrome and a set flag bit can then be stored in the syndrome memory 148. As a result, the ECC logic 144 will not detect a flag bit that has not been set when performing the first refresh in the reduced refresh mode.

Figure 3:
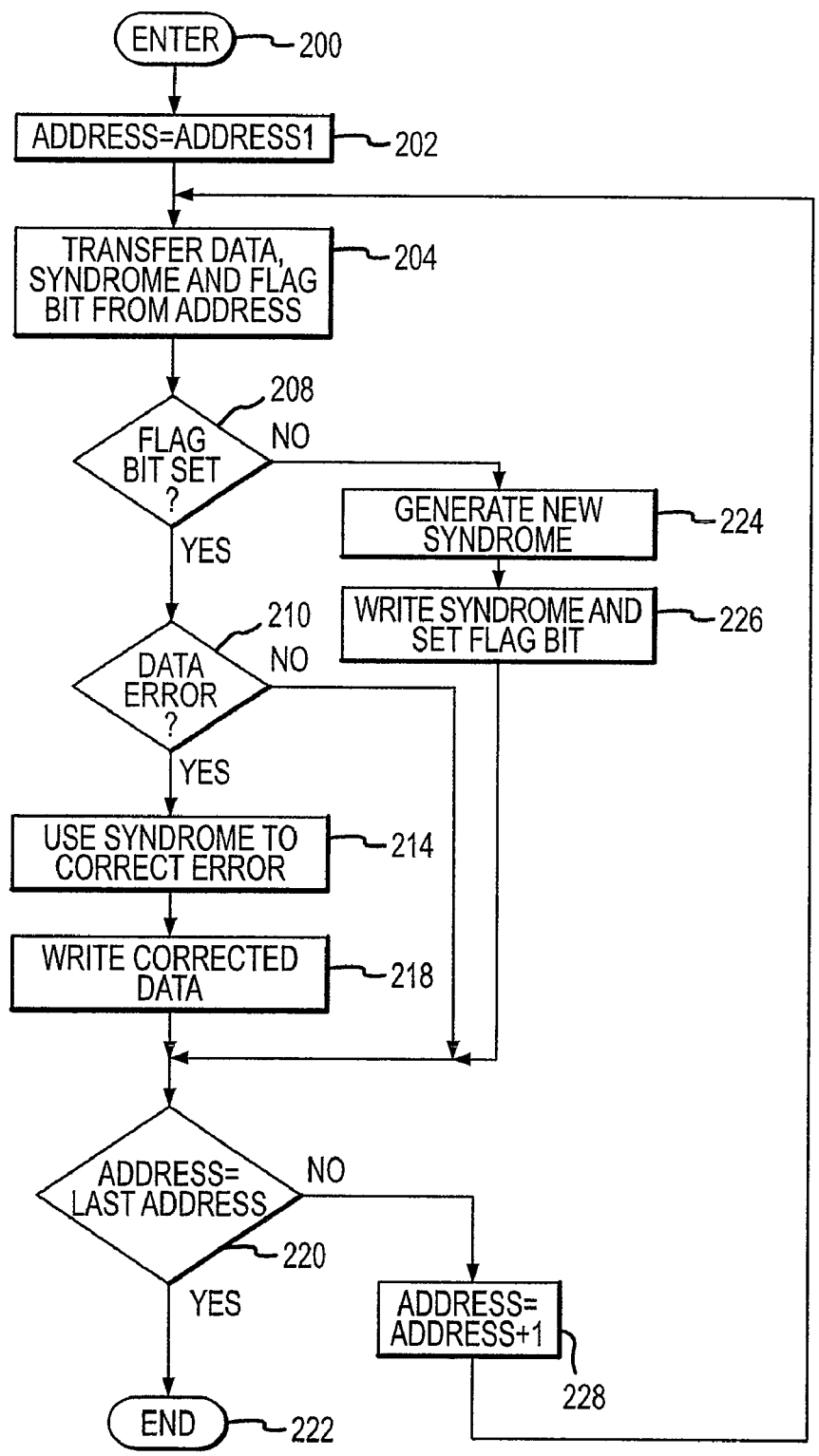
FIG. 3 is a flow chart showing the operation of the memory device of FIG. 1 in checking the integrity of data stored in the memory device.

A process that is similar to the process shown in FIG. 2 can also be used to reduce power consumption when background ECC techniques are being used to insure the integrity of data stored in the DRAM 122. As with the process shown in FIG. 2, each time data are written the DRAM array 140, the flag bit of a corresponding syndrome is reset. The process, which is shown in FIG. 3, is entered at 200 when the integrity of a group of data, such as data stored in an entire row, is to be checked. The ECC controller 146 initializes an address to a first address in the DRAM array 140 at step 202. This address is preferably the address for the first row of memory cells in the DRAM array 140. In step 204, the ECC controller 146 causes data stored in the DRAM array 140 at the current address, a corresponding syndrome and a corresponding flag bit to be transferred from the DRAM array 140 and the syndrome memory 148, respectively, to the ECC logic 144. The ECC logic 144 checks to see if a flag bit appended to the syndrome is set at step 208. If the flag bit is set, meaning that the data has not been modified since the last integrity check, the ECC logic 144 uses the syndrome to determine if any data retention errors have arisen at step 210. If the syndrome indicates the data are in error, the syndrome is used to correct the error at step 214. The corrected data are then written to the DRAM array 140 at step 218 before progressing to step 220. If no data retention error was detected at step 210, the process branches directly to step 220.

If the ECC logic 144 determines at step 208 that the flag bit is not set, meaning that the data corresponding to the syndrome have been modified, the process branches to step 224 where the ECC logic 144 generates a new syndrome. This syndrome, as well as a set flag bit, are then written to the syndrome memory 148 at step 226 before branching to step 220.

At step 220, a check is made to determine if the data transferred to the ECC logic 144 for integrity checking was stored in the final address of the DRAM array. If so, the process ends at step 222 until the integrity check is again initiated at step 200. Otherwise, the address is incremented at step 228, and the process returns to step 204.

The use of the process shown in FIG. 3 can considerably reduce the power consumed by the DRAM 122 since it will often not be necessary to generate and store syndromes for the data stored in the DRAM array 140. Instead, it will be necessary to generate and store a syndrome for data only if the data have been modified. If there was no way of determining if the data had changed, it would be necessary to generate and store a syndrome each time data was written to the DRAM 122. Furthermore, if the syndrome did not match data stored in the DRAM array 140, there would be no way to determine if a data retention error had occurred (in which case the syndrome should be used to generate and store corrected data) or if new data had been written to that location (in which case the syndrome should not be used to generate and store corrected data).

Figure 4:
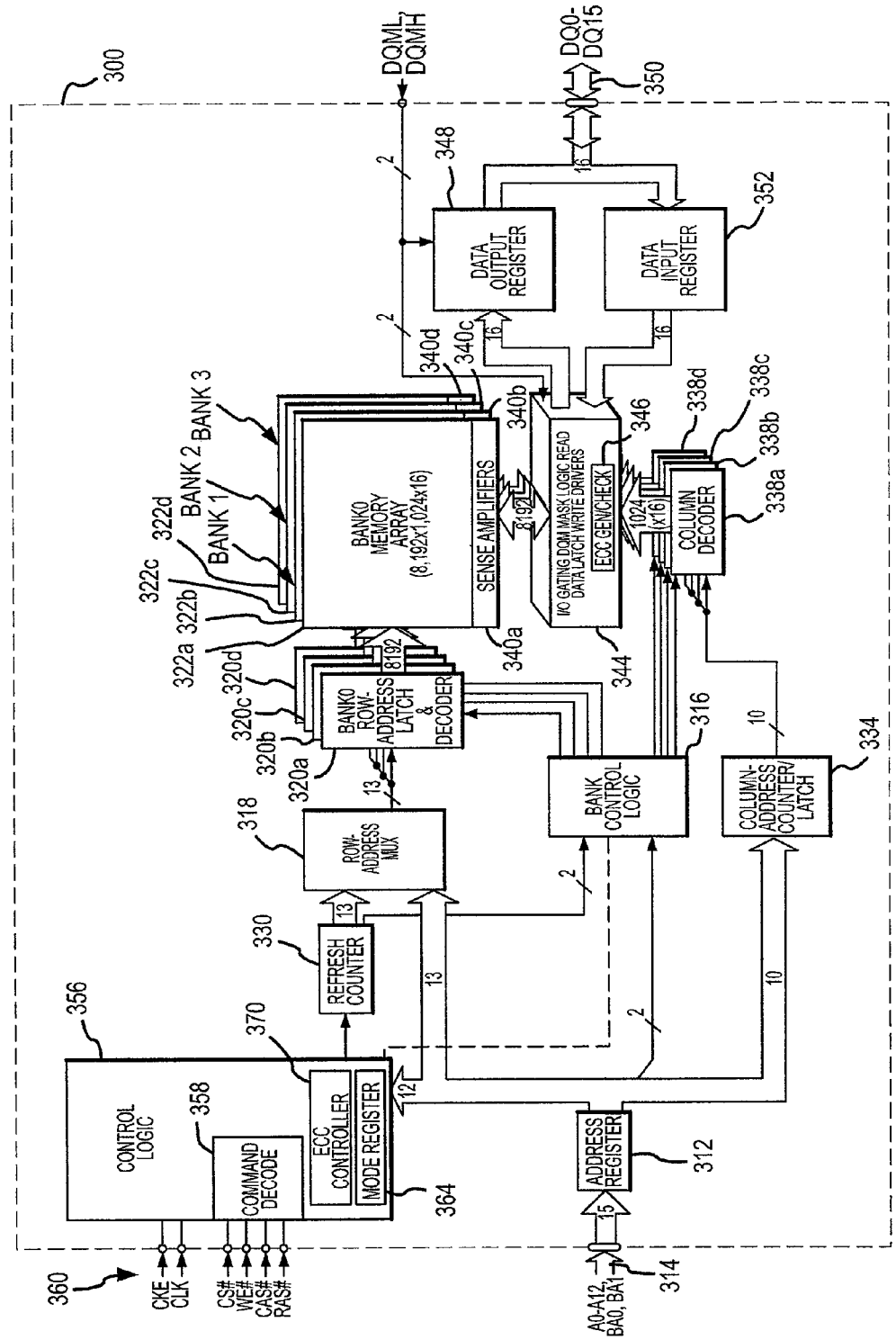
FIG. 4 is a block diagram of a memory device according to one embodiment of the invention that may be used in the computer system of FIG. 1.

A synchronous DRAM ("SDRAM") 300 according to one embodiment of the invention is shown in FIG. 4. The SDRAM 300 includes an address register 312 that receives bank addresses, row addresses and column addresses on an address bus 314. The address bus 314 is generally coupled to a memory controller like the memory controller 120 shown in FIG. 1. Typically, a bank address is received by the address register 312 and is coupled to bank control logic 316 that generates bank control signals, which are described further below. The bank address is normally coupled to the SDRAM 300 along with a row address. The row address is received by the address register 312 and applied to a row address multiplexer 318. The row address multiplexer 318 couples the row address to row address latch & decoder circuit 320a-d for each of several banks of memory cell arrays 322a-d, respectively.

One of the latch & decoder circuits 320a-d is enabled by a control signal from the bank control logic 316 depending on which bank of memory cell arrays 322a-d is selected by the bank address. The selected latch & decoder circuit 320 applies various signals to its respective bank 322 as a function of the row address stored in the latch & decoder circuit 320. These signals include word line voltages that activate respective rows of memory cells in the banks 322a-d.

The row address multiplexer 318 also couples row addresses to the row address latch & decoder circuits 320a-d for the purpose of refreshing the memory cells in the banks 322a-d. The row addresses are generated for refresh purposes by a refresh counter 330. The refresh counter 330 periodically increments to output row addresses for rows in the banks 322a-d. During operation in the low power, reduced refresh rate mode described above, the refresh counter 330 causes the memory cells in the banks 322a-d to be refreshed at a rate that is sufficiently low that data errors are likely to occur. Refreshing the memory cells at this low rate causes relatively little power to be consumed during self-refresh or other reduced refresh periods. During operation in a normal refresh mode, the refresh counter 330 periodically increments at a normal refresh rate that generally does not result in data retention errors during a normal refresh mode. The refresh of the memory cells is typically performed every 64 ms.

After the bank and row addresses have been applied to the address register 312, a column address is applied to the address register 312. The address register 312 couples the column address to a column address counter/latch circuit 334. The counter/latch circuit 334 stores the column address, and, when operating in a burst mode, generates column addresses that increment from the received column address. In either case, either the stored column address or incrementally increasing column addresses are coupled to column address & decoders 338a-d for the respective banks 322a-d. The column address & decoders 338a-d apply various signals to respective sense amplifiers 340a-d through column interface circuitry 344. The column interface circuitry 344 includes conventional I/O gating circuits, DQM mask logic, read data latches for storing read data from the memory cells in the banks 322a-d and write drivers for coupling write data to the memory cells in the banks 322a-d.

The column interface circuitry 344 also includes an ECC generator/checker 346 that essentially performs the same function as the ECC logic 144 in the DRAM 122 of FIG. 1. The ECC generator/checker 346 may be implemented by conventional means, such as by chains of exclusive OR gates implementing a Hamming code. Syndromes corresponding to the data stored in the memory cells in the banks 322a-d and corresponding flag bits may be stored in one or more of the banks 322a-d. Data from one of the banks 322a-d are sensed by the respective set of sense amplifiers 342a-d. When data are transferred from the memory cells of the banks 322a-d during the reduced power refresh mode, the corresponding syndrome and flag bit is coupled to the ECC generator checker 346. The ECC generator/checker 346 then checks and, if necessary, corrects the data as explained above. In the event data are being coupled from the banks 322a-d for a read operation, the data are coupled to a data output register 348, which applies the read data to a data bus 350. Data read from one of the banks 322a-d may be coupled to the data bus 350 through the data output register 348 without be processed by the ECC generator/checker 346. Alternatively, the read data may be processed by the ECC generator/checker 346 to detect and correct errors in the read data.

Data to be written to the memory cells in one or more of the banks 322a-d are coupled from the data bus 350 through a data input register 352 directly to write drivers in the column interface circuitry 344 without interfacing with the ECC generator/checker 346. However, the flag bit corresponding to the write data is reset as explained above to indicate that any data stored in the location where the data are written has been modified. Alternatively, write data may be coupled to the ECC generator/checker 346 so it can generate a corresponding syndrome. The write data, the corresponding syndrome and a set flag bit are then coupled to write drivers in the column interface circuitry 344, which couple the data, syn-drome and flag bit to the memory cells in one of the banks 322a-d. A pair of complementary data mask signals "DQML" and "DQMH" may be applied to the column interface circuitry 344 and the data output register 348 to selectively alter the flow of data into and out of the column interface circuitry 344, such as by selectively masking data to be read from the banks of memory cell arrays 322a-d.

The above-described operation of the SDRAM 300 is controlled by control logic 356, which includes a command decoder 358 that receives command signals through a command bus 360. These high level command signals, which are typically generated by a memory controller such as the memory controller 120 of FIG. 1, are a clock chip select signal CS#, a write enable signal WE#, a column address strobe signal CAS#, and a row address strobe signal RAS#, with the "#" designating the signal as active low. Various combinations of these signals are registered as respective commands, such as a read command or a write command. The control logic 356 also receives a clock signal CLK and a clock enable signal CKE, which allow the SDRAM 300 to operate in a synchronous manner. The control logic 356 generates a sequence of control signals responsive to the command signals to carry out the function (e.g., a read or a write) designated by each of the command signals. The control logic 356 also applies signals to the refresh counter 330 to control the operation of the refresh counter 230 during refresh of the memory cells in the banks 322. The control signals generated by the control logic 356, and the manner in which they accomplish their respective functions, are conventional. Therefore, in the interest of brevity, a further explanation of these control signals will be omitted.

The control logic 356 also includes a mode register 364 that may be programmed by signals coupled through the command bus 360 during initialization of the SDRAM 300. The mode register 364 then generates a mode bit that is used by the control logic 356 to enable the reduced power ECC modes described above with respect to FIGS. 2 and 3. Finally, the control logic 356 also includes an ECC controller 370 that essentially performs the functions of the ECC controller 146 in the DRAM 122 of FIG. 1. The ECC controller 146 causes the control logic 356 to issue control signals to the ECC generator/checker 346 and other components to generate syndromes and flag bits for storage in the banks 322a-d, and to check and correct data read from the banks 322a-d using the stored syndromes and flag bits.

Figure 5:
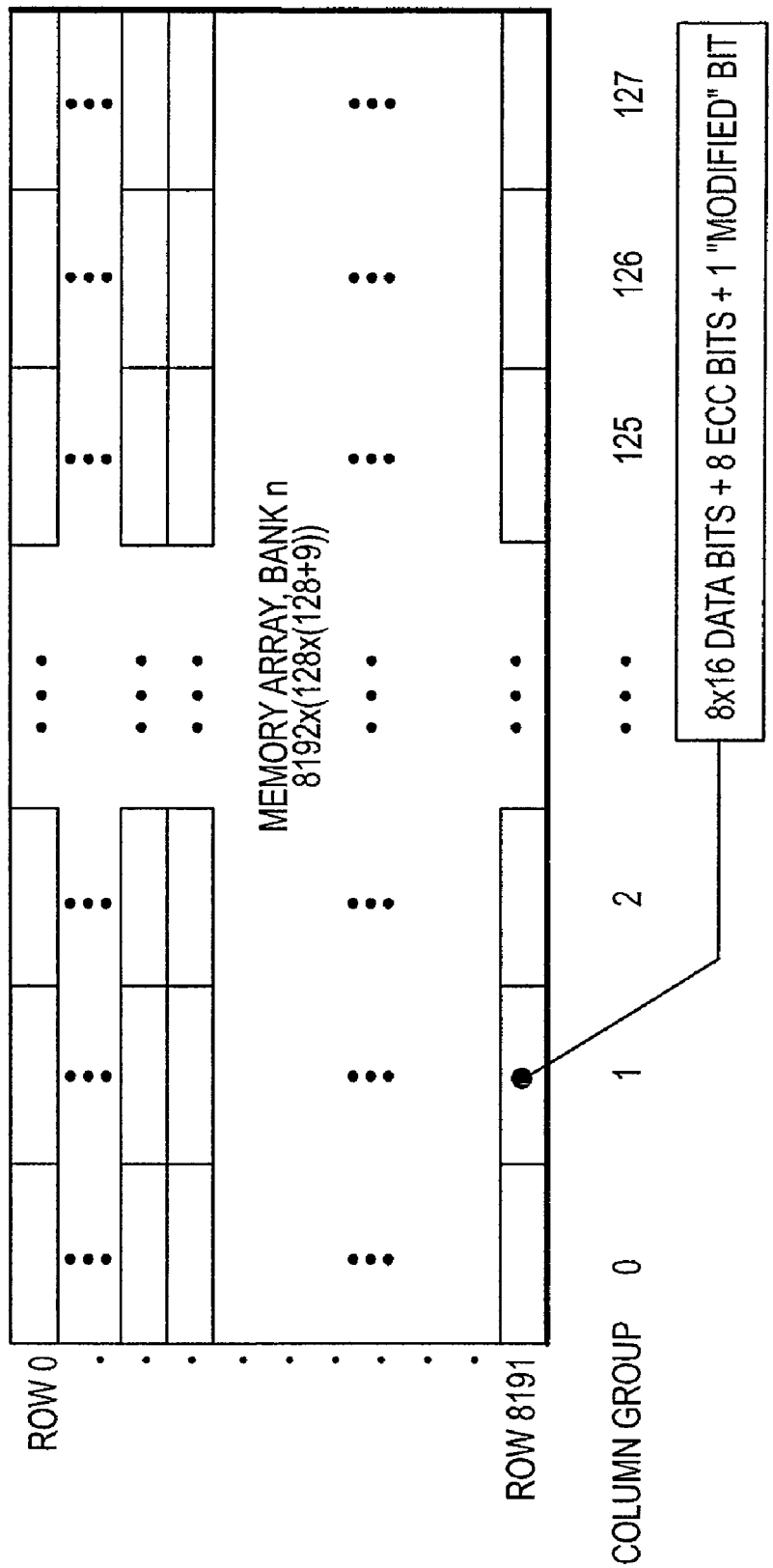
FIG. 5 is an address map showing the organization of data stored in the memory device of FIG. 1 or FIG. 4 according to one embodiment of the invention.

Although the SDRAM device 300 can have a variety of configurations, in one embodiment the storage of data in the SDRAM device 300 is organized as shown in FIG. 5. As shown in FIG. 5, each row of memory cells in the DRAM array 140 contains 128 column groups, and each column group contains 128 bits of data arranged as 8 16-bit words plus an additional 9 bits that are used to store an 8-bit ECC syndrome and 1 flag bit. The 8 syndrome bits are capable of correcting a single bit error in the respective column group. If the ability to correct a larger number of bits is desired, then the number of syndrome bits can be increases accordingly.

Figure 6:
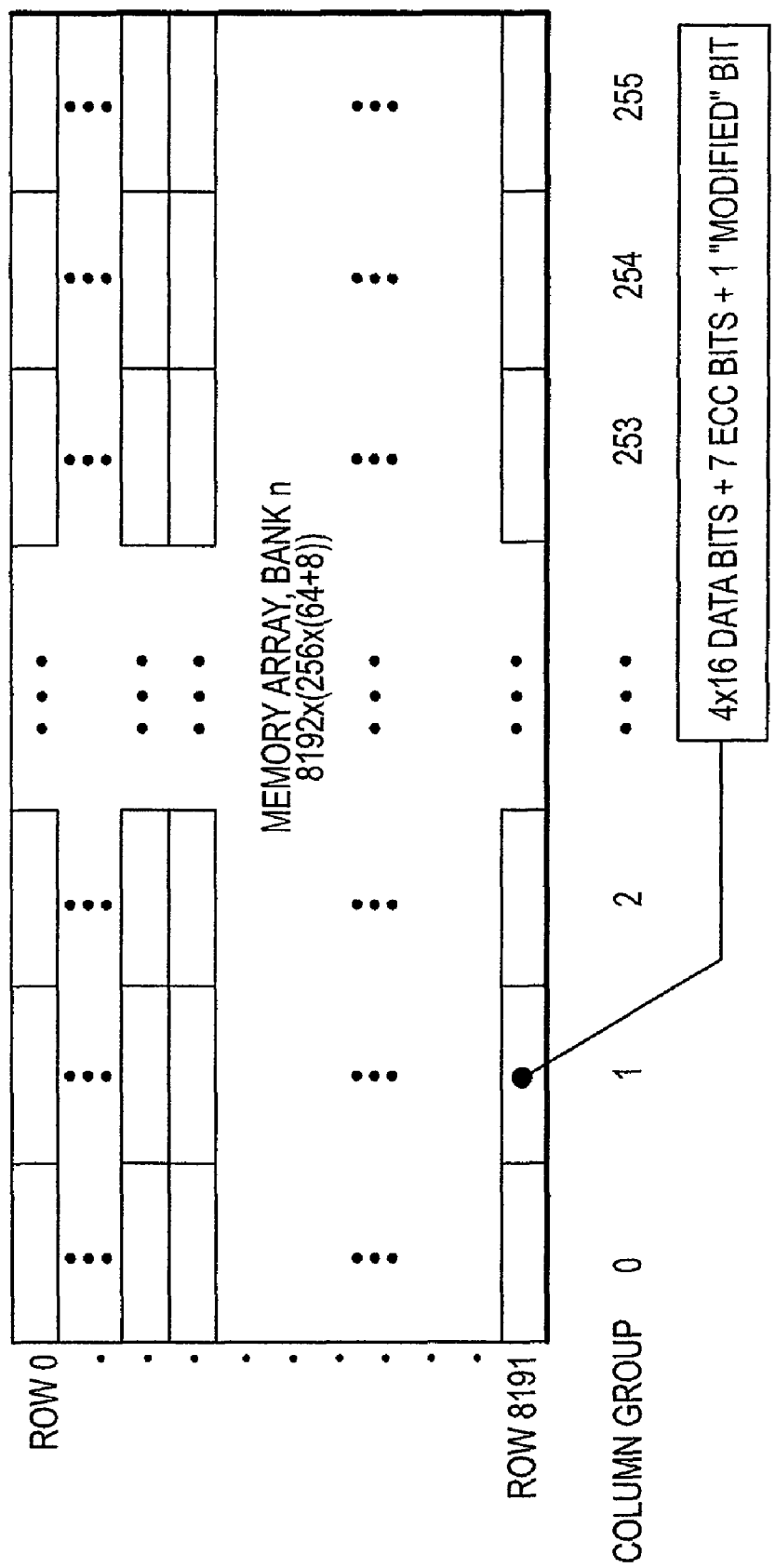
FIG. 6 is an address map showing the organization of data stored in the memory device of FIG. 1 or FIG. 4 according to another embodiment of the invention.

One disadvantage of the arrangement for storing data as shown in FIG. 5 is that each column group contains an odd number of bits, i.e., 128 data bits, 8 syndrome bits and 1 flag bit. However, memory devices generally use rows with an even number of columns. To alleviate this disadvantage, data can be stored in the SDRAM device 300 using organization shown in FIG. 6. As shown in FIG. 6, each row of memory cells in the DRAM array 140 contains 256 column groups, and each column group contains 64 bits of data arranged as 4 16-bit words plus an additional 8 bits that are used to store a 7-bit ECC syndrome and 1 flag bit. The 7 syndrome bits are capable of correcting a single bit error in the 64 bits in the respective column group. As a result, each column group now contains an even number of bits, i.e., 64 data bits, 7 syndrome bits and 1 flag bit.

Although the present invention has been described with reference to the disclosed embodiments, persons skilled in the art will recognize that changes may be made in form and detail without departing from the spirit and scope of the invention. For example, although the reduced power refresh mode has been described in the context of a self-refresh reduced power mode, it will be understood that it may also be used in other refresh modes. Other variations will also be apparent to one skilled in the art. Accordingly, the invention is not limited except as by the appended claims.

We claim:

1. In a semiconductor device, a method of ensuring the integrity of data stored in the semiconductor device during refresh of memory cells, the method comprising:
generating an error checking and correction ("ECC") syndrome for individual ones of a plurality of groups of data bits stored in the memory cells;
storing the respective ECC syndrome and a respective flag bits for the individual ones of the groups of data bits;
changing the flag bit if any of the data bits in the respective group are modified during the period between successive refreshes;
when refreshing the memory cells:
using the flag bit to determine if any of the data bits in the respective group have been modified since the last refresh; and
if the flag bit indicates any of the data bits in the respective group have been modified:
generating a new ECC syndrome for the group; and
storing the new ECC syndrome.

2. The method of claim 1 wherein the act of generating an ECC syndrome for individual ones of a plurality of groups of data bits stored in the semiconductor device comprises generating an ECC syndrome having an odd number of bits.

3. The method of claim 1 wherein the act of storing the ECC syndrome comprises storing the ECC syndrome in the semiconductor device.

4. The method of claim 3 wherein the act of storing the ECC syndrome in the semiconductor device comprises storing the ECC syndrome in the memory cells.

5. The method of claim 1 wherein the act of storing the flag bit comprises storing the flag bit in the semiconductor device.

6. The method of claim 5 wherein the act of storing the flag bit in the semiconductor device comprises storing the flag bit in the memory cells.

7. The method of claim 1 wherein the act of generating an ECC syndrome for individual ones of a plurality of groups of data bits stored in the memory cells comprises generating the ECC syndromes within the semiconductor device.

8. The method of claim 1 wherein the memory cells are arranged in rows and wherein the act of generating an ECC syndrome for individual ones of a plurality of groups of data bits stored in the memory cells comprises generating an ECC syndrome for individual ones of a plurality of groups of data bits stored in the memory cells when each row of memory cells is initially refreshed.

9. The method of claim 1 wherein the memory cells are arranged in rows and a plurality of the groups of data bits are stored in each row of the memory cells.

10. The method of claim 1, further comprising using the ECC syndrome to check the correctness of the respective group of data bits stored in the memory cells being refreshed if the flag bit indicates that none of the data bits in the respective group have been modified.

11. The method of claim 10 wherein, if the check of the correctness of the respective group of data bits indicates that any of the data bits are in error, using the ECC syndrome to correct the data bits in the respective group, thereby generating corrected data bits, and storing the corrected data bits in the memory cells.

12. A method of refreshing memory cells in a semiconductor device, the semiconductor device having stored therein an error checking and correction ("ECC") syndrome and a respective flag bit for each of a plurality of groups of data bits stored in the memory cells, the method comprising:
in a normal refresh mode, refreshing the memory cells at a rate that is sufficiently high to substantially preclude data retention errors;
in a reduced power refresh mode, refreshing the memory cells at a rate that is sufficiently low to allow the occurrence of a number of data retention errors that can be corrected by the ECC syndrome; and
in the reduced power refresh mode:
retrieving the flag bit for the respective group of data stored in the memory cells being refreshed; and
determining if the flag bit has a value indicative of data modification during a period between successive refreshes.

13. The method of claim 12, further comprising, if the flag bit has the value indicative of data modification, generating and storing a new ECC syndrome for the group, and changing the flag bit value.

14. The method of claim 12, wherein the memory cells are arranged in rows, the method further comprising generating and storing the ECC syndrome and flag bit for each of a plurality of groups of data bits stored in the memory cells when each row of memory cells is initially refreshed after transitioning from the normal refresh mode to the reduced power refresh mode.

15. The method of claim 14 wherein the act of storing the ECC syndrome comprises storing the ECC syndrome in the semiconductor device.

16. The method of claim 15 wherein the act of storing the ECC syndrome in the semiconductor device comprises storing the ECC syndrome in the memory cells.

17. The method of claim 14 wherein the act of storing the flag bit comprises storing the flag bit in the semiconductor device.

18. The method of claim 17 wherein the act of storing the flag bit in the semiconductor device comprises storing the flag bit in the memory cells.

19. The method of claim 14 wherein the act of generating the ECC syndrome comprises generating the ECC syndrome in the semiconductor device.

20. The method of claim 12 wherein the memory cells are arranged in rows, and wherein a plurality of the groups of data bits are stored in each row of the memory cells.

21. The method of claim 12, wherein the memory cells are arranged in rows, the method further comprising using the ECC syndrome to check the correctness of the respective group of data bits stored in the row of memory cells being refreshed if the flag bit indicates that none of the data bits in the respective group have been modified.

22. The method of claim 21 wherein the act of using the ECC syndrome to check the correctness of the respective group of data bits stored in the row of memory cells being refreshed comprises using the ECC syndrome to check the correctness of the respective group of data bits stored in the row of memory cells being refreshed when the memory cells are being refreshed in the normal refresh mode.

23. A memory device, comprising:
memory cells;
an address decoder, the address decoder being operable to activate cells of the memory cells responsive to received addresses;
a read data path operable to couple read data from selected memory cells to a plurality of data bus terminals;
a write data path operable to couple write data from the plurality of data bus terminals to selected memory cells;
control logic operable to cause the write data to be coupled from the data bus terminals to the memory cells and to cause the read data to be coupled from the memory cells to the data bus terminals;
refresh circuitry operable to refresh the memory cells in the array at a first rate in a reduced power refresh mode, the refresh circuitry further being operable to refresh the memory cells in the array at a second rate that is significantly faster than the first rate in a normal refresh mode;
an ECC generator/checker operable in the reduced power refresh mode to generate an error checking and correction ("ECC") syndrome corresponding to each of a plurality of items of data stored in the memory device; and
an ECC controller operable in the reduced power refresh mode to store respective ECC syndromes generated by the an ECC generator/checker, the ECC controller further being operable to store a flag bit, the ECC controller further being operable when memory cells are refreshed to use at least one of the flag bits to determine if any portion of the respective item of data stored in the memory cells being refreshed has been modified, and, if so, to cause the ECC generator/checker to generate a new ECC syndrome for the item of data and to store the new ECC syndrome generated by the ECC generator/checker.

24. The memory device of claim 23 wherein the ECC controller is further operable in the normal refresh mode when data are read from the memory cells to use at least one of the flag bits to determine if any portion of the respective item of data being read has been modified, and, if not, to cause the ECC generator/checker to use the ECC syndrome to check for the presence of an error in each item of data in the data being read from the memory cells.

25. The memory device of claim 24 wherein the ECC controller is further operable to cause the ECC generator/checker to generate corrected data responsive to the ECC generator/checker determining that an item of data contains an error.

26. The memory device of claim 25 wherein the ECC controller is further operable to cause the corrected data to be stored in the memory cells.

27. The memory device of claim 23 wherein each of the ECC syndromes generated by the ECC generator/checker has an odd number of bits.

28. The memory device of claim 23 wherein the ECC controller is operable to store the ECC syndromes generated by the an ECC generator/checker in the memory cells.

29. The memory device of claim 23 wherein the ECC controller is operable to store the flag bits in the memory cells.

30. A computer system, comprising:
a processor;
a memory device, comprising:
memory cells;
an address decoder, the address decoder being operable to activate memory cells corresponding to received addresses;
a read data path operable to couple read data from selected memory cells to a plurality of data bus terminals;
a write data path operable to couple write data from the plurality of data bus terminals to selected memory cells;
control logic operable to cause the write data to be coupled from the data bus terminals to the memory cells and to cause the read data to be coupled from the memory cells to the data bus terminals;
refresh circuitry operable to refresh the memory cells at a first rate in a reduced power refresh mode, the refresh circuitry further being operable to refresh the memory cells in the array at a second rate that is significantly faster than the first rate in a normal refresh mode;
an ECC generator/checker operable in the reduced power refresh mode to generate an error checking and correction ("ECC") syndrome corresponding to each of a plurality of items of data stored in the memory device;
an ECC controller operable in the reduced power refresh mode to store respective ECC syndromes generated by the an ECC generator/checker, the ECC controller further being operable to store a flag bit, the ECC controller further being operable when memory cells are refreshed to use at least one of the flag bits to determine if any portion of the respective item of data stored in the memory cells being refreshed has been modified, and, if so, to cause the ECC generator/checker to generate a new ECC syndrome for the item of data and to store the new ECC syndrome generated by the ECC generator/checker; and
a memory controller coupled to the processor and to the memory device, the memory controller being operable to cause the memory device to read and write data.

31. The computer system of claim 30 wherein the ECC controller is further operable in the normal refresh mode when data are read from the memory cells to use at least one of the flag bits to determine if any portion of the respective item of data being read has been modified, and, if not, to cause the ECC generator/checker to use the ECC syndrome to check for the presence of an error in each item of data in the data being read from the memory cells.

32. The computer system of claim 31 wherein the ECC controller is further operable to cause the ECC generator/checker to generate corrected data responsive to the ECC generator/checker determining that an item of data contains an error.

33. The computer system of claim 32 wherein the ECC controller is further operable to cause the corrected data to be stored in the memory cells.

34. The computer system of claim 30 wherein each of the ECC syndromes generated by the ECC generator/checker has an odd number of bits.

35. The computer system of claim 30 wherein the ECC controller is operable to store the ECC syndromes generated by the an ECC generator/checker in the memory cells.

36. The computer system of claim 30 wherein the ECC controller is operable to store the flag bits in the memory cells.

37. The method of claim 1, wherein the respective flag bits have a first value when the respective ECC syndrome is stored, and wherein said changing the flag bit if any of the data bits in the respective group are modified during the period between successive refreshes comprises changing the flag bit from the first value to a second value, and wherein said method further comprises if the flag bit indicates any of the data bits in the respective group have been modified, changing the flag bit from the second value to the first value.

38. The method of claim 1, further comprising, when refreshing the memory cells, retrieving the flag bit for the respective group of data stored in the memory cells being refreshed.

39. The method of claim 1, wherein the semiconductor device comprises a DRAM device.

40. The memory device of claim 23, wherein the flag bit has a first value when a corresponding one of the ECC syndromes is stored and a second value when any portion of the item of data to which the flag bit corresponds is modified.

41. The memory device of claim 23, wherein the memory device comprises a DRAM device.

42. The system of claim 30, wherein the flag bit has a first value when a corresponding one of the ECC syndromes is stored and a second value when any portion of the item of data to which the flag bit corresponds is modified.

43. The system of claim 30, wherein the memory device comprises a DRAM device.

* * * * *

UNITED STATES PATENT AND TRADEMARK OFFICE
CERTIFICATE OF CORRECTION

PATENT NO. : 8,413,007 B2
APPLICATION NO. : 13/026833
DATED : April 2, 2013
INVENTOR(S) : J. Thomas Pawlowski et al.

It is certified that error appears in the above-identified patent and that said Letters Patent is hereby corrected as shown below:

In the claims

In column 11, line 27, in Claim 23, delete "the an" and insert -- the --, therefor.

In column 11, line 58, in Claim 28, delete "the an" and insert -- the --, therefor.

In column 12, line 24, in Claim 30, delete "the an" and insert -- the --, therefor.

In column 12, line 59, in Claim 35, delete "the an" and insert -- the --, therefor.

Signed and Sealed this
Eleventh Day of June, 2013

Teresa Stanek Rea
*Acting Director of the United States Patent and Trademark Office*